United States Patent [19]
Venkataramani et al.

[11] Patent Number: 5,591,372
[45] Date of Patent: Jan. 7, 1997

[54] PIEZOELECTRIC COMPOSITE WITH ANISOTROPIC 3-3 CONNECTIVITY

[75] Inventors: Venkat S. Venkataramani, Clifton Park; Lowell S. Smith, Niskayuna, both of N.Y.

[73] Assignee: Generla Electric Company, Schenectady, N.Y.

[21] Appl. No.: 531,840

[22] Filed: Sep. 22, 1995

[51] Int. Cl.$^6$ .................................................. C04B 35/00
[52] U.S. Cl. .......................... 252/62.9 R; 252/62.9 PZ; 501/32; 501/134; 501/136; 501/137; 501/95; 428/260; 428/272; 428/289; 428/290
[58] Field of Search ...................... 252/62.9 R, 62.9 PZ; 428/260, 272, 289, 290; 501/32, 134, 136, 137, 95; 264/28

[56] References Cited

U.S. PATENT DOCUMENTS

| | | | |
|---|---|---|---|
| 4,122,041 | 10/1978 | Mahler | ..................................... 251/449 |
| 4,330,593 | 5/1982 | Shrout et al. | ..................... 252/62.9 PZ |

OTHER PUBLICATIONS

"Injection Molded Fine–Scale Piezoelectric Composite Transducers", LJ Bowen, et al. 1993 Ultrasonics Symposium, 1993 IEEE, pp. 499–503. no month.

"Modeling 1–3 Composite Piezoelectrics: Thickness–Mode Oscillations", W A Smith, B A Auld, IEEE Trans. on Ultrasonics Ferroelectrics and Frequency Control, vol. 38, No. 1, Jan. 1991.

"Properties of Composite Piezoelectric Materials for Ultrasonic Transducers", W A Smith, et al., 1984 Ultrasonics Symposium, IEEE 1984, pp. 539–544. no month.

"The Role of Piezocomposites in Ultrasonic Transducers", W A Smith, 1989 Ultrasonics Symposium, 1989 IEEE, pp. 755–766. no month.

"Development of 1–3 Ceramic–Air Composite Transducers", C. Oakley, et al., SPIE vol. 1733 (1992) pp. 274–283. no month.

"Freeze–formed Silica Fibers", W. Hahler, et al., May 1980, Central Research & Development Dept., E.I. duPont de Nemours & Company, Wilmington, Delaware.

*Primary Examiner*—Melissa Bonner
*Attorney, Agent, or Firm*—Noreen C. Johnson; William H. Pittman

[57] ABSTRACT

A piezoelectric or electrostrictive composite exhibiting anisotropic 3-3 connectivity with a dense ceramic phase and an infiltrate polymer phase. The ceramic phase is an interconnected ceramic lamelli structure that is arranged substantially parallel in one direction. The ceramic lamelli have greater connectivity in the z direction than in the x and y directions, while the connectivity in the x and y directions are essentially equal.

8 Claims, 4 Drawing Sheets

PIEZOELECTRIC COMPOSITE WITH ANISOTROPIC 3-3 CONNECTIVITY

FIELD OF THE INVENTION

This invention is related to piezoelectric or electrostrictive composites. In particular, it is related to anisotropic 3-3 connectivity ceramicpolymer composites used in electromechanical devices.

BACKGROUND OF THE INVENTION

Piezoelectric ceramic-polymer composites, hereafter referred to as piezoelectric composites and piezoelectric ceramics, are used in transducers for medical ultrasound imaging. In medical ultrasound there is an increasing need to improve the imaging range and resolution, as determined by the sensitivity and bandwidth of the transducer. There is also a move toward high frequency transducer use for endoscopic surgical procedures such as laparoscopy and intravascular imaging. Thus, piezoelectric composite transducers provide these medical procedures with better axial and lateral resolution.

Three major advantages enjoyed by piezoelectric composites over piezoelectric ceramics are reduced specific acoustic impedance (Z), increased thickness coupling ($k_t$), and reduced planar coupling ($k_p$). Trade offs in piezoelectric composite design must be made, as these three parameters cannot be optimized simultaneously.

Presently, piezoelectric composites having 1-3 connectivity are most commonly used in medical ultrasound transducer applications. 1-3 connectivity composites are commonly used because of the significantly reduced planar coupling constants ($k_p$) that can be achieved over those that can be achieved by using homogeneous ceramic or isotropic 3-3 connectivity composites of the same materials.

A 1-3 connectivity composite is one where one phase, typically the ceramic phase, is self connected in one direction (z direction or thickness direction) of the composite, while the other phase, typically the infiltrate phase, is self connected in three directions of the composite. A 1-3 connectivity composite may be made by embedding a phase of aligned ceramic fibers or rods in an infiltrate phase or may be made by cutting deep grooves in a monolithic block of ceramic and filling the empty spaces with an infiltrate phase. The latter technique is referred to as dice and fill. In a 1-3 connectivity composite, the minimum dimensions of the ceramic pillars and the spaces are limited by a dicing blade and the mechanical strength of the ceramic. As a result, 1-3 composites do not always satisfy the increasing need for high frequency transducer operation in medical ultrasound applications.

It is desirable to have a piezoelectric composite with a structure of an interconnected lamelli and an interconnected interlamellar region which can be processed into an anisotropic 3-3 connectivity composite having improved electromechanical properties of a 1-3 connectivity composite. It is also desirable to have a piezoelectric composite that can be used in an electromechanical device having reduced planar coupling, a high thickness coupling constant, and reduced specific acoustic impedance. It is further desirable to have a composite and a resulting electromechanical device that is cost effective, reproducible, and adaptable into a manufacturing environment.

SUMMARY OF THE INVENTION

The present invention is directed towards a piezoelectric or electrostrictive composite having anisotropic 3-3 connectivity which is made from a ceramic phase of interconnected lamelli and an interconnected interlamellar region containing an infiltrate phase. Although the invention is described in terms of piezoelectric or electrostrictive materials, other materials may be used in the invention. The invention may also be described as being an anisotropic 3-3 connectivity composite electromechanical device having a specific acoustic impedance of about 20 MRayls or less, a thickness coupling constant greater than about 0.4 and a planar coupling constant less than about 0.4. The invention may be further described as a composite having anisotropic 3-3 connectivity comprising a ceramic phase of interconnected lamelli where the connectivity of the lamelli in a z direction is greater than the connectivity of the lamelli in a x and y direction and the connectivity of the lamelli in the x and y direction is about equal or essentially equal, and where the lamelli comprise from about 5 volume percent to about 80 volume percent of the composite and are about 200 microns or less in width; and an infiltrate phase formed in interconnected interlamellar regions wherein the interlamellar region comprises from about 20 volume percent to about 95 volume percent of the composite and is about 500 microns or less in width.

An advantage of the composite of this invention is that it is anisotropic with 3-3 structural connectivity, but has the electromechanical properties of 1-3 connectivity composites. All other known 3-3 connectivity composites are isotropic. Another advantage is that the device of the instant invention, utilizing the anisotropic 3-3 connectivity piezoelectric composite of this invention, has less lateral connectivity than a device utilizing isotropic 3-3 connectivity piezoelectric composite, thereby reducing the planar coupling modes of the device. The combination of the coupling modes achieved by the device in the instant invention leads to better resolution and imaging range in medical ultrasound applications than those achieved by devices made from isotropic 3-3 connectivity piezoelectric composites. The anisotropic 3-3 connectivity composite device of this invention operates as a pseudo 1-3 connectivity composite device because of the improved coupling modes. Furthermore, this invention allows the use of finer feature sizes of the lamelli and interlamellar regions than are obtainable from the present state of the art processes for fabricating 1-3 composites. Thus, the devices of the instant invention may be operated at the high frequency ranges needed in medical ultrasound applications.

DETAILED DESCRIPTION OF THE INVENTION

It has been discovered that an improved composite for electromechanical devices may be made which comprises an anisotropic 3-3 connectivity composite, made up of a ceramic phase of interconnected lamelli and an interconnected interlamellar region containing an infiltrate phase. Generally, the composite is a piezoelectric or electrostrictive composite. By the term piezoelectric is meant those composites which retain a remnant polarization and a remnant strain after an electrical field which has been applied to them is removed. Likewise, by the term electrostrictive is meant those materials which exhibit notable polarization or strain proportional to the square of an applied electric field.

Figure 1:
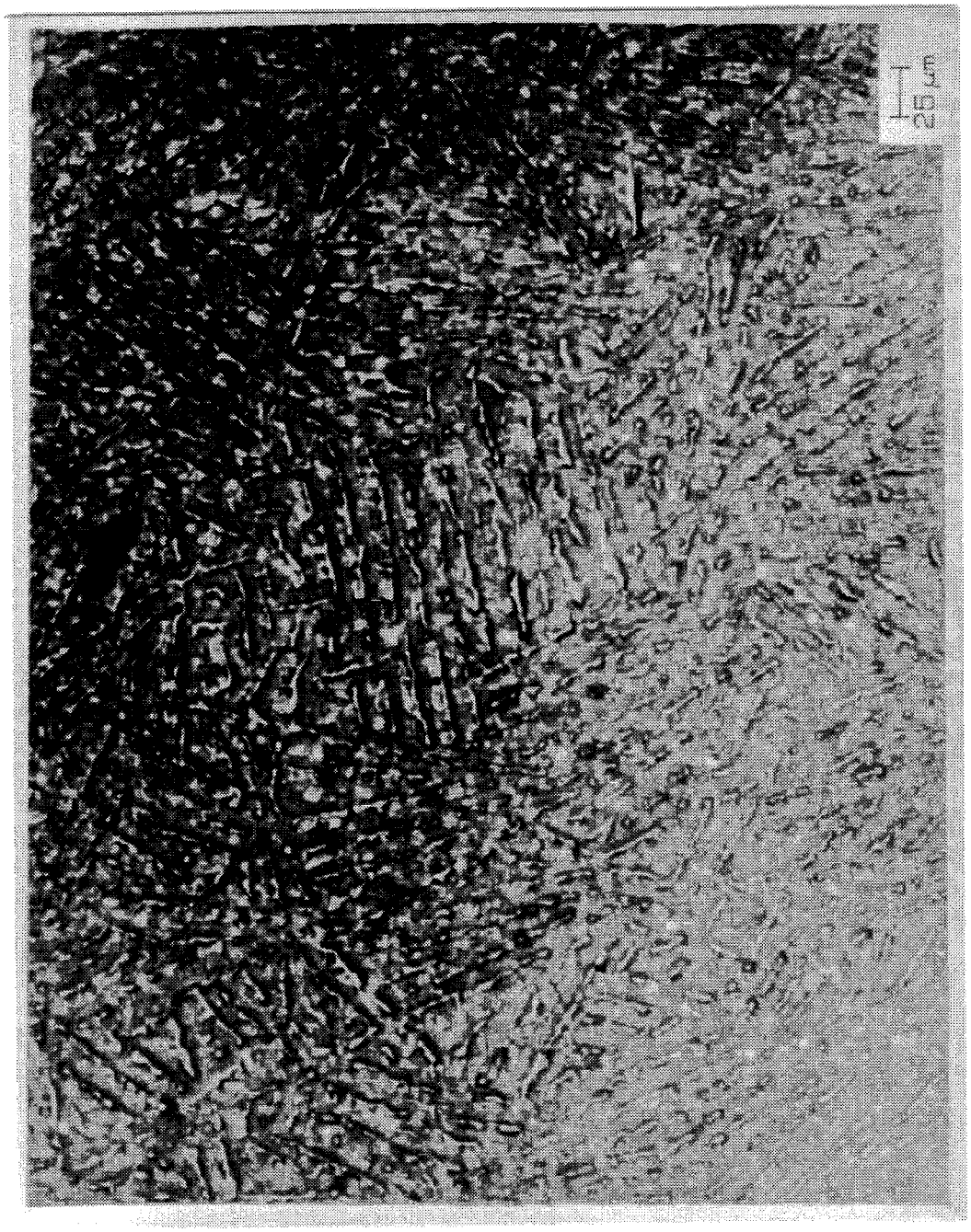
FIG. 1 is a photomicrograph of a 60 volume percent PZT-5H—40 volume percent polyether amine epoxy anisotropic 3-3 connectivity composite where it shows the interconnected lamelli of the composite and the interconnected interlamellar region of the composite.

In this invention, the term "interconnected lamelli", hereafter referred to as lamelli, means the region of the composite that contains interconnected walls of ceramic material and is interconnected with itself on three planes in the x, y, and z directions. FIG. 1a. indicates that region of the composite that is the interconnected lamelli. It should be pointed out that the interconnected ceramic lamelli are arranged in an ordered array in a preform to form the anisotropic 3-3 connectivity composite. The ceramic lamelli are densified, having at least 95 percent density.

The term "interconnected interlamellar region", hereafter referred to as interlamellar region, means the region of the composite material that lies between the interconnected lamelli. This region is also interconnected with itself on three planes. The interconnected interlamellar region comprises the infiltrate phase of the composite which may be a polymer, a glass or a cement. The interconnected interlamellar region forms a skeleton that is intertwined with the ceramic phase, the interconnected lamelli of the composite. FIG. 1b indicates that region of the composite that is the interconnected interlamellar region.

The device of the instant invention can be an electromechanical device and hereafter will be referred to as the device. Examples of devices contemplated for use in this invention includes, but are not limited to, transducers, actuators, sensors, and variations thereof.

As stated, the composite of the instant invention may be a piezoelectric composite or a electrostrictive composite. This is determined by the ceramic phase of the composite. For instance, the ceramic phase of the instant invention may be a piezoelectric or an electrostrictive material such as a metal titanate, metal zirconate, metal niobate, metal tantalate, metal tungstate, metal stannate, or solid solution thereof. To illustrate, commonly used materials may be lead zirconate titanate, also referred to as PZT, or lead magnesium niobate-lead titanate, also referred to as PMN-PT. Examples of metal titanates that may be used as the ceramic phase in the instant invention include barium titanate, lead titanate, strontium titanate, and bismuth titanate. An example of a metal zirconate is lead zirconate. Examples of metal niobates are lead niobate, strontium barium niobate, lithium niobate and lead metaniobate. Solid solutions include lead zirconate titanate, lead magnesium niobate-lead titanate, lead zinc niobate-lead titanate.

The infiltrate phase of the composite may include polymers, low specific acoustic impedance glasses, low specific acoustic impedance cements, or mixtures thereof. The polymer may be an epoxide, urethane, elastomer, silicone, and mixtures thereof. By low specific acoustic impedance glass and low specific acoustic impedance cement is meant those glasses and cements with a specific acoustic impedance of less than or about 12 MRayls.

Anisotropic 3-3 connectivity refers to the microstructure of the composite of the instant invention. By the term "anisotropic" is meant that material properties of the composite can exhibit different values when measured along different axes, x, y, and z axes. The material properties of the anisotropic 3-3 connectivity composite and resulting 0 device that are of particular interest are dielectric constant ($K_{33}^T$), planar coupling constant ($k_p$), specific acoustic impedance (Z), and thickness coupling constant ($k_t$). The phrase "3-3" in an "anisotropic 3-3 connectivity composite" designates the number of directions to which the ceramic phase and infiltrate phase of the composite are self connected. In the instant invention, having 3-3 connectivity, each phase of the composite, the ceramic and the infiltrate phase, has three directions of connectivity. The two phases are also interconnected in three dimensions creating interconnected skeletons of the two phases. (See FIG. 1a and 1b.)

Composites of 3-3 connectivity typically exhibit isotropic characteristics because of the uniform structure in three dimensions. The instant invention however, although a 3-3 connectivity composite, exhibits anisotropic electromechanical characteristics where the dielectric constant, specific acoustic impedance, and coupling constants are involved. This is attributed to the fact that the connectivity of the ceramic lamelli in the z-direction or thickness direction is not the same or uniform with the x and y directions. In other words, the connectivity in the x-y plane or lateral directions is essentially isotropic, and the connectivity in the z direction is greater than the connectivity of the lamelli in the x and y directions, thereby yielding anisotropic properties to the 3-3 connectivity composite. The electromechanical properties of the anisotropic 3-3 connectivity composite are similar to those exhibited by the 1-3 connectivity composites currently being used in medical ultrasound applications and sonar hydrophones.

Figure 2B:
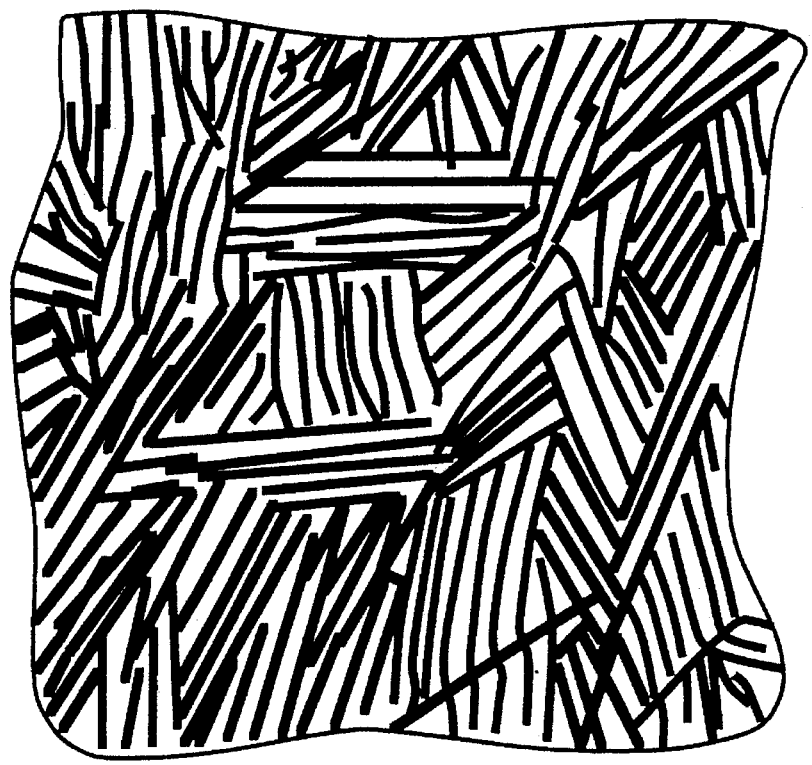
FIGS. 2a and 2b sketches which illustrate the alignment of the interconnected lamelli of the anisotropic 3-3 connectivity composite of the instant invention from a side view (2a) and a top view (2b).
Figure 2A:
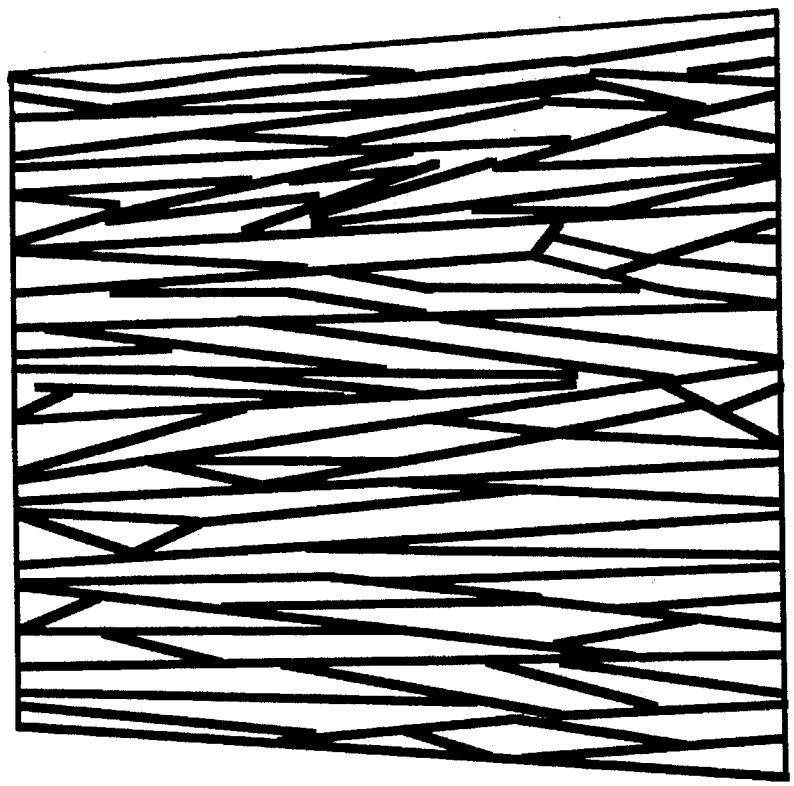

In the instant invention, the structure of the composite is not random in three dimensions, but consists of a ceramic phase of lamelli that are substantially parallel to one another although they are interconnected in three planes. The anisotropic material characteristics of the composite of the instant invention occur because the lamelli of the ceramic phase of the anisotropic 3-3 connectivity composite are aligned substantially parallel to one another. The term "substantially parallel", as used herein, means that the lamelli of the instant invention have a distinct orientation relative to one another that is not random and favors one direction as demonstrated by FIG. 2. Further, the dielectric constant of the composite provides evidence of alignment of the lamelli in a favored direction. Those anisotropic material characteristics displayed by the device of the instant invention render it superior to those devices made from isotropic 3-3 connectivity composites of the same or similar chemical composition. Thus, although the invented composite is 3-3 connectivity, it exhibits electromechanical properties more similar to a 1-3 connectivity composite and thus is an anisotropic 3-3 connectivity composite.

The anisotropic 3-3 connectivity composite of this invention is made by forming a sintered ceramic preform of substantially parallel lamelli that is later infiltrated by another phase. The ceramic preform is made from a slurry of ceramic particles, water, binder, and dispersant that is directionally solidified by freeze drying. A gel may also be used. As a result of the freeze drying, substantially parallel lamelli of solid ceramic material are formed. The preform thus obtained is sintered to densify the ceramic lamelli. The dense open structured ceramic lamelli preform is then impregnated with an infiltrate phase and may be heat treated to form the composite. The method of making the composite and preform of this invention is the subject of commonly owned and assigned copending patent application, Ser. No. 08/538,151 (Attorney Docket Number RD-24,254).

A preferred embodiment of this invention is a transducer comprising an anisotropic 3-3 connectivity piezoelectric composite. The anisotropic 3-3 connectivity piezoelectric composite may be made from any mutually compatible combination of a piezoelectric ceramic and another material. One skilled in the art would choose a ceramic and an infiltrate phase which when used in combination yield the desired material properties such as thickness coupling constant, dielectric constant, density, and specific acoustic impedance. To demonstrate, a particularly advantageous anisotropic 3-3 connectivity piezoelectric composite for use in electromechanical devices includes a lead zirconate titanate (PZT) lamelli ceramic phase and a urethane interlamellar infiltrate polymer phase.

Because the anisotropic 3-3 connectivity piezoelectric or electrostrictive composite of the instant invention exhibits improved electromechanical coupling constants and specific acoustic impedance over other devices using isotropic 3-3 connectivity composites, the anisotropic 3-3 connectivity composite may be used in transducers for medical ultrasound applications where there is an increasing need for improved resolution and imaging range.

The spatial scale and chemical composition of the anisotropic 3-3 connectivity composite affect the material properties of the device. The term "spatial scale" refers to the width of the interlamellar region which is the infiltrate phase (see FIG. 1b) as well as the width of the lamelli that make up the ceramic phase (see FIG. 1a). The achievable spatial scale of anisotropic 3-3 connectivity composites is finer than the spatial scale currently achievable in 1-3 connectivity composites and as such, electromechanical devices made from the anisotropic 3-3 connectivity composite of the instant invention will operate at higher frequency levels.

The width of the interlamellar region may be about 500 microns or less, more preferably the width is about 100 microns or less and most preferably the width is about 10 microns or less. Additionally, the width of the individual interconnected lamelli may be about 200 microns or less. More preferably, the width of the interconnected lamelli may be about 50 microns or less and most preferably the width of the interconnected lamelli may be about 5 microns or less.

The composition of the anisotropic 3-3 connectivity composite is from about 5 volume percent to about 80 volume percent ceramic and from about 20 volume percent to about 95 volume percent infiltrate phase. A preferred composition is from about 5 volume percent to about 60 volume percent ceramic material and from about 40 volume percent to about 95 volume percent infiltrate phase. A most preferred composition is from about 5 volume percent to about 30 volume percent ceramic and from about 70 to about 95 volume percent infiltrate phase. One skilled in the art will choose the volume percent of ceramic and the spatial scale that will yield the material properties desired in the application.

The invention may also be described as being an anisotropic 3-3 connectivity composite electromechanical device having a specific acoustic impedance of about 20 MRayls or less, a thickness coupling constant greater than about 0.4 and a planar coupling constant less than about 0.4. A preferred specific acoustic impedance of the instant invention is about 15 MRayls or less.

The following examples further demonstrate the invention.

EXAMPLE 1

A transducer comprising an anisotropic 3-3 connectivity piezoelectric composite of dimensions 1.4 cm×2.0 cm×0.10 cm was prepared with a chemical composition of about 60 volume percent PZT-5H ceramic and about 40 volume percent polyether amine epoxy. The width of the lamelli ranged from about 10 microns to about 80 microns, while the width of the interlamellar region ranged from about 10 microns to about 50 microns. A second transducer of 100 percent PZT-5H ceramic of similar size was made. Measurements were made of the material properties of the two transducers. Comparison data between the ceramic and composite is shown in TABLE 1.

Figure 3A:
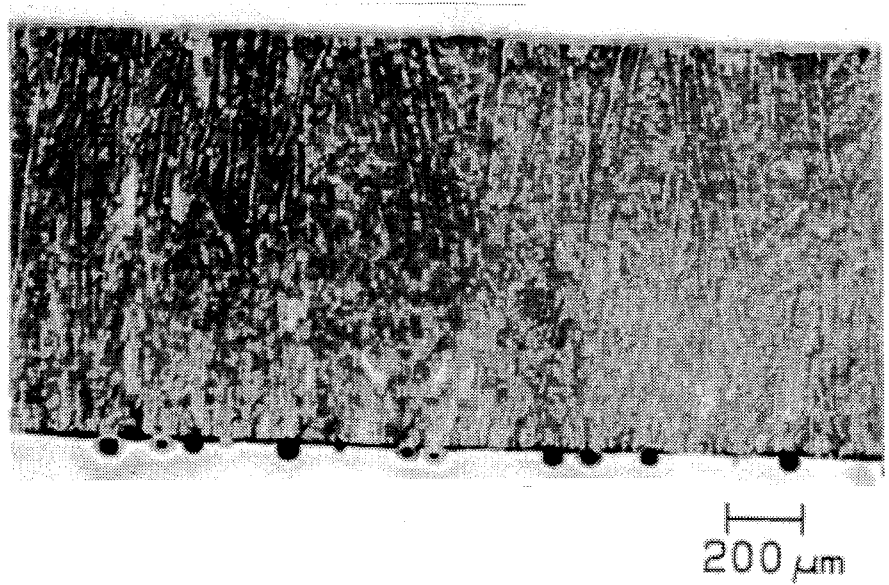
FIGS. 3a and 3b are photomicrographs of a 60 volume percent PZT-5H—40 volume percent polyether amine epoxy anisotropic 3-3 connectivity composite showing the side view (3a) and top view (3b) of the composite.
Figure 3B:
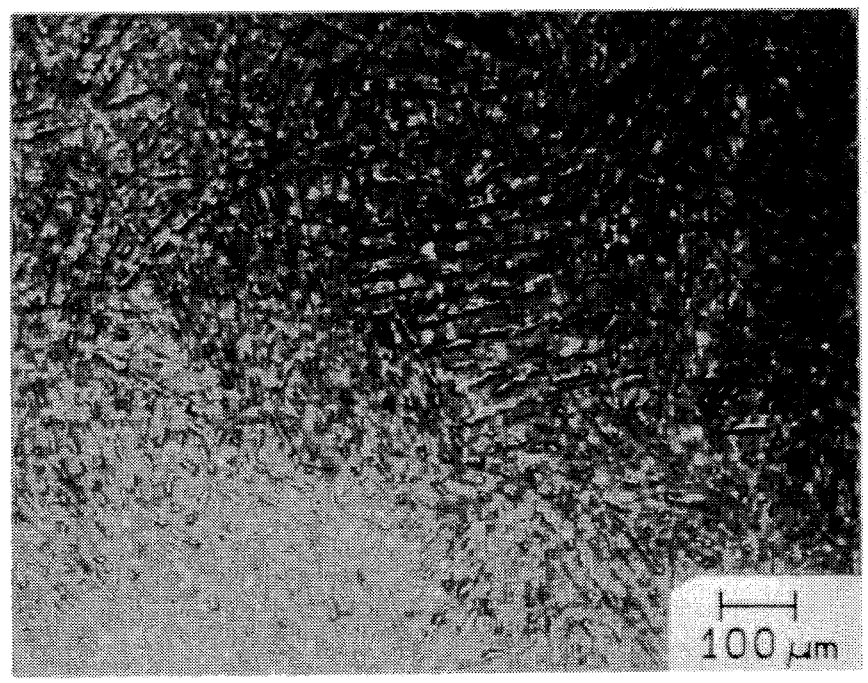

The microstructure of the PZT-5H—epoxy composite is shown in FIG. 3a and 3b. The substantially parallel lamellar arrangement of the ceramic phase can be seen from the edge section in FIG. 3a. Lateral connectivity of the ceramic phase is reduced.

Figure 4A:
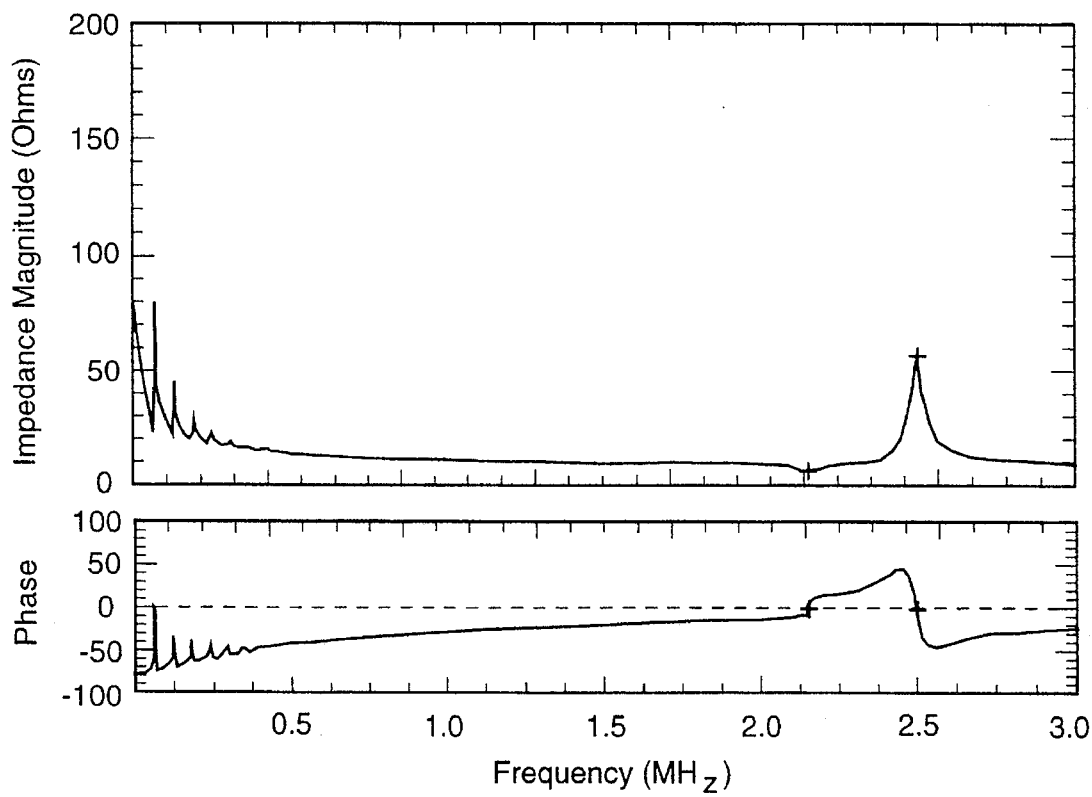
FIG. 4a is a plot of the electrical impedance over various frequencies of a 100 volume percent PZT-5H ceramic transducer.
Figure 4B:
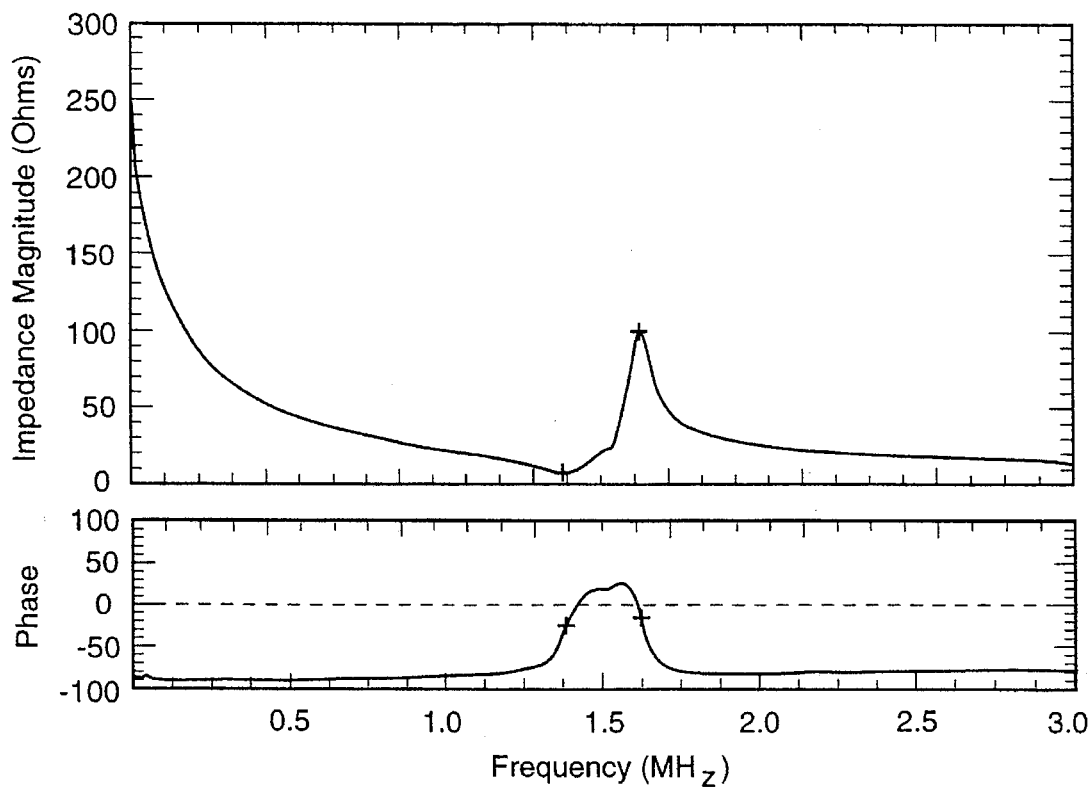
FIG. 4b is a plot of the electrical impedance over various frequencies of a 60 volume percent PZT-5H—40 volume percent polyether amine epoxy anisotropic 3-3 connectivity composite transducer.

The planar coupling in the transducer made from the PZT-5H—epoxy composite is reduced compared to the planar coupling in the transducer made from 100 percent PZT-5H ceramic as shown in FIG. 4. A series of periodic resonances is clearly visible in the 100 percent PZT-5H ceramic transducer because of the low frequency lateral modes that are essentially absent in the PZT-5H—epoxy composite transducer.

TABLE 1

|  | PZT-5H ceramic | PZT-5H - epoxy composite |
| --- | --- | --- |
| Thickness coupling cnst. ($k_t$) | 0.53 | 0.63 |
| Planar Coupling Constant ($k_p$) | 0.58 | 0.22 |
| Spec. Acoustic Imped.-MRayls (Z) | 33 | 18.9 |
| Thickness Mode Resonance-MHz | 1.75 | 2.5 |
| Dielectric Constant ($K_{33}^T$) | 3200 | 1400 |

EXAMPLE 2

Ten samples of anisotropic 3-3 connectivity composite were made. The ceramic phase was PZT-5H and the infiltrate phase was polyether amine epoxy. Material properties of the samples were measured as indicated below in TABLE 2.

The typical value of the dielectric constant ($K_{33}^T$) of a 60 volume percent PZT-5H isotropic 3-3 connectivity composite is about 600 to 1000. For an isotropic 3-3 connectivity composite, $\log K_{33}^T = V_1 \log K_{33}^T{}_1 + V_2 \log K_{33}^T{}_2$, where V and $K_{33}^T$ are the volume percent and dielectric constant of phase 1 and 2 respectively. As a 3-3 connectivity composite changes from being isotropic to anisotropic the dielectric constant changes so that $K_{33}^T = V_1 K_{33}^T{}_1 + V_2 K_{33}^T{}_2$ when the most anisotropic arrangement of lamelli and interlamellar region occurs. Thus, the values of the dielectric constant ($K_{33}^T$) of samples made from the anisotropic 3-3 connectivity composite of the instant invention as shown in TABLE 2 show an increase in the dielectric constant of the composite which demonstrates the substantially parallel alignment of the lamelli.

Additionally, the thickness coupling constant ($k_t$) and specific acoustic impedance (Z) show improved performance of the electromechanical devices made from the anisotropic 3-3 connectivity composite of this invention.

TABLE 2

| Sample | PZT-5H Vol. % | Density gm/cm$^3$ | Thick. Coupling Constant $k_t$ | Specific Acoustic Impedance Z (MRayls) | Dielectric Constant $K_{33}^T$ |
|---|---|---|---|---|---|
| 1 | 61 | 4.87 | 0.56 | 18.01 | 1546 |
| 2 | 60 | 4.77 | 0.57 | 17.63 | 1614 |
| 3 | 63 | 5.02 | 0.51 | 17.46 | 1346 |
| 4 | 65 | 5.16 | 0.49 | 17.77 | 1347 |
| 5 | 63 | 5.07 | 0.44 | 16.35 | 1152 |
| 6 | 47 | 3.73 | 0.41 | 12.25 | 946 |
| 7 | 59 | 4.71 | 0.42 | 14.70 | 1042 |
| 8 | 72 | 5.72 | 0.42 | 18.58 | 1262 |
| 9 | 67 | 5.35 | 0.54 | 18.85 | 1226 |
| 10 | 68 | 5.40 | 0.63 | 18.87 | 1406 |

What is claimed is:

1. A composite having anisotropic 3-3 connectivity comprising:

a ceramic phase made from a slurry comprising ceramic particles, water, binder, and dispersant that is directionally solidified by freeze drying to form interconnected lamelli where the connectivity of the lamelli in a z direction is greater than the connectivity of the lamelli in a x and y direction and the connectivity of the lamelli in the x and y direction is equal, where the lamelli comprise from about 5 volume percent to about 80 volume percent of the composite and are about 200 microns or less in width, and lamelli are aligned substantially parallel to one another; and an infiltrate phase formed in interconnected interlamellar regions wherein the interlamellar region comprises from about 20 volume percent to about 95 volume percent of the composite, is about 500 microns or less in width, and wherein the infiltrate phase is selected from a group consisting of a polymer, a low specific acoustic impedance glass, or a low specific acoustic impedance cement where the specific acoustic impedance of the glass or cement is less than or about 12 MRayls and where the polymer is an urethane, elastomer, silicone, or mixture thereof.

2. The composite of claim 1, wherein the ceramic is piezoelectric.

3. The composite of claim 1, wherein the ceramic is selected from a group consisting of a metal titanate, metal zirconate, metal niobate, metal tantalate, metal tungstate, metal stannate, or solid solution thereof.

4. The composite of claim 3, wherein the metal titanate is selected from a group consisting of a barium titanate, lead titanate, strontium titanate, and bismuth titanate.

5. The composite of claim 3, wherein the ceramic is lead zirconate titanate or lead magnesium niobate-titanate.

6. An anisotropic 3-3 connectivity composite for use as an electromechanical device comprising a piezoelectric ceramic phase, said ceramic phase is made from a slurry comprising ceramic particles, water, binder, and dispersant that is directionally solidified by freeze drying to form interconnected lamelli where the connectivity of the lamelli in a z direction is greater than the connectivity of the lamelli in a x and a y direction, said connectivity in the x and y direction being equal, and lamelli are aligned substantially parallel to one another; and an infiltrate phase formed in interconnected interlamellar regions where said infiltrate phase is a polymer, low specific acoustic impedance glass, or a low specific acoustic impedance cement and the specific acoustic impedance of the glass or cement is less than about 12 MRayls.

7. An anisotropic 3-3 connectivity composite of claim 6 having a thickness coupling constant greater than about 0.4, a planer coupling constant of less than about 0.4, and a specific acoustic impedance of about 20 MRayls or less.

8. A composite according to claim 1 having a thickness coupling constant greater than about 0.4, a planer coupling constant of less than about 0.4, and a specific acoustic impedance of about 20 MRayls or less.

\* \* \* \* \*

UNITED STATES PATENT AND TRADEMARK OFFICE
CERTIFICATE OF CORRECTION

PATENT NO. : 5,591,372
DATED : January 7, 1997
INVENTOR(S) : Venkat S. Venkataramani and Lowell S. Smith It is certified that error appears in the above-indentified patent and that said Letters Patent is hereby corrected as shown below:

On the title page: Item [73] Assignee

Please correct spelling of Assignee from "Generla Electric Company" to -- General Electric Company.

Signed and Sealed this

Seventeenth Day of June, 1997

Attest:

BRUCE LEHMAN

*Attesting Officer*  *Commissioner of Patents and Trademarks*